March 24, 1970 K. J. HORSTMANN ET AL 3,503,009

TUNING FORK FOR ELECTROMECHANICAL OSCILLATORS

Filed June 17, 1968

Horstmann, Douglas & Goodliff, INVENTORS

By - Bierman & Bierman, ATTORNEYS.

United States Patent Office 3,503,009
Patented Mar. 24, 1970

3,503,009

TUNING FORK FOR ELECTROMECHANICAL OSCILLATORS

Kenneth John Horstmann, 14 Park Lane, Lower Weston, Bath, Somerset; Colin Grahame Douglas, Stoneybroke, Watergates, Colerne, Wiltshire; and Alan Guiver Goodliff, 27 St. Peters Road, Midsomer Norton, Somerset, all of England Filed June 17, 1968, Ser. No. 737,516
Int. Cl. H03b *5/30*
U.S. Cl. 331—155 8 Claims

ABSTRACT OF THE DISCLOSURE

A constant frequency oscillator comprising a tuning fork with transducers on both sides connected electrically in opposition and a piezoelectric device on the clamp supporting the node.

BACKGROUND OF INVENTION

This invention relates to electromechanical oscillators of the kind comprising tuning forks and more especially to oscillators employing small tuning forks of the kind which may be used as electromechanical frequency determining devices or in electromechanical oscillators, in which the tuning fork is maintained in continuous oscillation by electrical means.

The use of tuning forks for all kinds of time-keeping purposes is developing rapidly, because of the high degree of precision with which the frequency of vibration of a tuning fork may be maintained in spite of substantial variations in ambient conditions such as temperature, so that the volume of manufacture of tuning forks for these purposes far outstrips the manufacture of tuning forks for their original purpose of providing a tone standard.

The modern tuning fork is normally constructed of a material which has a substantially zero temperature coefficient of elasticity and for use in timing mechanisms it is, of course, necessary to maintain the fork in continuous vibration. A well known method of doing this is to introduce an electromagnetic transducer near the vibrating end of each of the tines, with two coils, one of which is connected in the input circuit of an amplifier and the other of which is connected in the output circuit of the same amplifier, so that the vibration of one tine of the fork causes small signals to be induced in the associated coil, the signals being applied to the amplifier input and the amplified output signals being applied to the other coil which maintains the fork in vibration. Thus the energy required to maintain the fork in vibration is drawn from the power supply of the amplifier which, in the case of a small fork and a single transistor amplifier, may be a very tiny battery. However with such an arrangement there is a risk of unwanted frequencies being generated if the tuning fork moves as a whole under shock.

The main object of the invention is to provide an improved arrangement in which these disadvantages are minimised or avoided.

SUMMARY OF THE INVENTION

According to the present invention an electromechanical oscillator comprises a substantially U-shaped tuning fork clamped in the region of its node between inner and outer clamp members adapted to be mounted on a support, a piezoelectric device secured to one of said clamp members in such a manner that it is subjected to a bending stress causing it to generate an E.M.F. as the fork vibrates, and transducers respectively associated with the tines of the fork and having their electrical circuits so connected in a series circuit that opposite vibrations of the tines generate a resultant E.M.F., the arrangement being such that the electrical output from either the piezoelectric device or from the transducer circuit may be amplified and applied to the other device or circuit to maintain the oscillation.

The means to clamp the two members together may comprise a rod by which the fork is supported, and the second transducer may be of the electromagnetic type.

Small rods, with adjusting nuts, may be fitted to the ends of the tines to enable the frequency of oscillation of the tines to be adjusted.

DESCRIPTION OF THE PREFERRED EMBODIMENT

Figures 1, 2, 3:
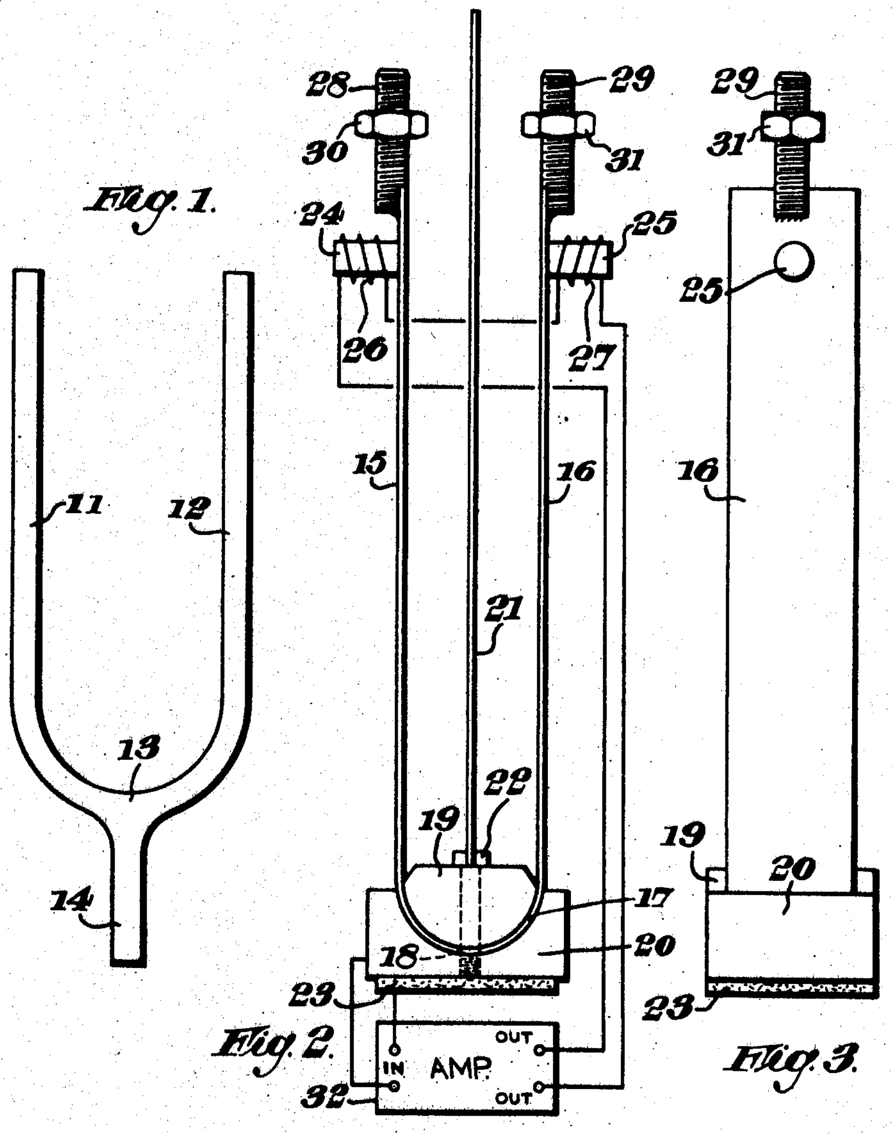
FIGURE 1 shows the outline of a conventional tuning fork showing the stem which is provided for mounting.
FIGURE 2 shows diagrammatically the arrangement of a tuning fork according to the invention.
FIGURE 3 is a side view of the tuning fork of FIGURE 2.

Referring to FIGURE 1 a conventional design of tuning fork, as used as a tone standard in musical applications and for other purposes comprises two tines 11 and 12 joined by a curved bridge piece 13, which forms a continuation of the tines, and having a stem 14 by which it may be mounted and which, if placed on a suitable sounding board will amplify the vibrations of the tines and provide a tone of considerable amplitude.

Such a tuning fork is frequently manufactured from a solid block of metal, usually steel of a type which may be hardened and tempered, and it is quite an expensive item. If it is made of steel its frequency of vibration may vary a little with temperature but this variation is not serious for musical work.

For instrumentation applications where constancy in frequency of vibration is of the greatest importance it is convenient to make the fork from an alloy having a zero temperature coefficient of elasticity and as such material is conveniently available in strip form it is beneficial from the point of view of efficient and economic production to take a strip of such material and bend it into the required "hair-pin" or U form. A support may then be welded, soldered or otherwise fixed to the centre of the curved portion, which is substantially symmetrically disposed with respect to the nodal point at which the vibrational movement is zero.

Where a fork of the conventional form shown in FIGURE 1 is used in an electromechanical oscillator the two transducers previously referred to are associated respectively with tines 11 and 12 and the same is true in the case of the known type of fork made from bent up strip material.

FIGURE 2 shows a tuning fork constructed according to the invention. It comprises a single U-shaped strip of material preferably having a substantially zero temperature co-efficient of elasticity and is composed of two straight portions respectively 15 and 16 constituting the tines of the fork and a curved portion 17. A hole is drilled in the centre of the curved portion at 18 to enable a supporting rod to pass through and an inner clamp member 19 is placed inside the bend 17, the inner clamp member being formed to the same radius as the inside radius of the fork so that it fits snugly.

An outer clamp member 20 is placed on the outside of the curved portion 17 of the fork, the outer clamp member having a radiused portion which is a close fit around the outer radius of the curve. A support rod 21 having a screw threaded end is provided with a shoulder 22 and the screw threaded end is passed through the inner clamp member and screwed into the member 20 so that the curved portion 17 of the fork is clamped between the inner and outer clamp members. The nodal point, at which there is no vibration, would normally lie at the centre of the hole 18 and all parts of the strip on each side of this point would vibrate, the amplitude of vibration increasing with increasing distance from the nodal point and the maximum amplitude being at the free ends of the tines. Due to the presence of the clamp members, and in dependence upon their mass and stiffness, the nodal point is moved and may actually lie outside the fork itself. It is nevertheless true that all parts of the assembly on the two sides of the nodal point will vibrate. The outer clamp member 20 and the inner clamp member 19 are made of materials such as steel hardened and ground which will flex slightly in response to the vibrations in the curved portion 17 of the fork and a piezoelectric transducer element 23 is secured to the outer face of the member 20 preferably by a conductive adhesive, such as silver-loaded araldite. Since, in vibrating, the tines of a tuning fork alternately move towards and away from each other it will be clear that the lower face of the base is very slightly bent to and fro due to these vibrations and accordingly small piezoelectric voltages appear which may be applied to the amplifier by leads not shown, which may be connected respectively to the outer surface of the piezo device 23 and the side face of the clamp 20 as viewed in FIGURE 3.

The second transducer is made in two parts and in the example being described small pole pieces, respectively 24 and 25, are secured respectively in corresponding positions to the two tines and each is inductively associated with a winding, respectively 26 and 27. These two windings are connected in such a sense that the E.M.F.'s add when the tines vibrate oppositely i.e. towards and away from each other, but when they vibrate in the same direction, as occurs when the tuning fork is subjected to shock, the E.M.F.'s cancel and there is no resultant.

Preferably the piezoelectric device 23 is connected to the input of the amplifier 32 and the coils 26 and 27 are connected to the amplifier output; however these connections may be reversed and the coils 26 and 27 connected to the amplifier input and the piezoelectric device 23 connected to the amplifier output. In such a case the piezoelectric device would be arranged to give a mechanical output.

In order to provide some adjustment in the frequency of vibration of the tuning fork small screw threaded rods, respectively 28 and 29, may be fixed to the ends of the two tines and small nuts, respectively 30 and 31, may be screwed on to the rods so that, by adjusting the position of the two nuts, the frequency of the fork may be altered within limits and the individual natural frequencies of the two tines may be balanced.

It will be evident that since the flexure in the curved part 17 of the fork is being used to operate the piezoelectric transducer 23 the normal base fixing arrangements cannot be employed in the fork according to the invention and, the support rod 21 which should extend through or be in line with the node, is accordingly secured to any convenient means to provide a support for the fork.

We claim:

1. An electromechanical oscillator comprising: a substantially U-shaped tuning fork, inner and outer clamping members adapted to clamp said tuning fork in the region of its node, a piezoelectric device secured to one of said clamp members so as to be subjected to a bending stress as the fork vibrates, transducers respectively associated with the tines of the fork and means connecting the electrical circuits of the transducers in a series circuit.

2. An electromechanical oscillator as claimed in claim 1 comprising: an electrical amplifier, electrical connections between the piezoelectric device and the input of said amplifier and electrical connections between the output at the amplifier and the series transducer circuit.

3. An electromechanical oscillator as claimed in claim 1 comprising: an electrical amplifier, electrical connections between the series transducer circuit and the input of the amplifier and electrical connections between the output of the amplifier and the piezoelectric device.

4. An electromechanical oscillator as claimed in claim 1 the transducers comprising: pole pieces extending laterally and outwardly from two ends of the tines, fixed coils operatively associated with the pole pieces respectively so that the vibrations of the pole pieces induce E.M.F.'s in the coils and electrical connections connecting said coils in a series circuit.

5. An electromechanical oscillator as claimed in claim 1 comprising: a substantially plane outer surface to said outer clamp member and a piezoelectric device secured to the surface in an operative manner.

6. An electromechanical oscillator as claimed in claim 1 comprising: adjustment members on the ends of the tines for adjusting the natural frequencies of vibration.

7. In an electrical control circuit a constant frequency control circuit comprising: an electrical amplifier having sets of input and output terminals, a U-shaped tuning fork, means clamping the tuning fork at its node, electromechanical transducers mounted on both sides of the tuning fork respectively, a piezoelectric device operatively mounted on the clamping means, electrical connections between the piezoelectric device and one of the sets of terminals at the amplifier and electrical connections to the other set of terminals of the amplifier and the transducers connected electrically in series opposition.

8. An electromechanical oscillator comprising: a mechanical tuning fork, an inner clamping member having a convex curved surface, an outer clamping member having a concave curved surface means clamping the node region of the tuning fork between said concave and convex surfaces, a plane surface to one of said clamping members, a piezoelectric device operatively secured to said plane surface to respond to distortions thereof as the fork vibrates electrical transducers mounted on both sides of the fork and electrical connections connecting said transducers in series opposition.

References Cited

UNITED STATES PATENTS 1,849,271 3/1932 Bower ............ 331—155

JOHN KOMINSKI, Primary Examiner

U.S. Cl. X.R.

331—156